(12) United States Patent
Lenchenkov (10) Patent No.: US 11,644,606 B1
(45) Date of Patent: May 9, 2023

(54) IMAGE SENSOR WITH SUB-PIXEL PHOTODIODE ARRAY WITH MULTIPLE MINI-WIRE GRID POLARIZERS FOR POLARIZATION IMAGING

(71) Applicant: OmniVision Technologies, Inc., Santa Clara, CA (US)

(72) Inventor: Victor Lenchenkov, Sunnyvale, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 0 days.

(21) Appl. No.: 17/501,586

(22) Filed: Oct. 14, 2021

(51) Int. Cl.
*G02B 5/30* (2006.01)
*H04N 5/232* (2006.01)

(52) U.S. Cl.
CPC ....... *G02B 5/3058* (2013.01); *H04N 5/23229* (2013.01)

(58) Field of Classification Search
CPC ............. G02B 5/3058; H04N 5/23229; H04N 5/2355; H04N 7/18; H04N 3/155
See application file for complete search history.

(56) References Cited

U.S. PATENT DOCUMENTS

| | | | | |
|---|---|---|---|---|
| 6,075,235 A * | 6/2000 | Chun | ......... | G01J 4/04 250/225 |
| 11,056,518 B2 * | 7/2021 | Mitani | ......... | H04N 5/23238 |
| 11,067,837 B2 * | 7/2021 | Pau | ......... | G02F 1/0136 |
| 2011/0267483 A1 * | 11/2011 | Kanamori | ......... | H04N 5/23229 348/240.1 |
| 2017/0284863 A1 * | 10/2017 | Nishiwaki | ......... | G01B 9/02041 |
| 2020/0013819 A1 * | 1/2020 | Toda | ......... | H01L 27/14625 |

OTHER PUBLICATIONS

Koifman et al., "Fujifilm Develops Multispectral Camera Based on Polarization-Sensing CIS", Image Sensors World, http://image-sensors-world.blogspot.com/2020/07/fujifilm-develops-multispectral-camera.html, Jul. 14, 2020, 10 pages.

Maruyama et al., 3.2-MP Back-Illuminated Polarization Image Sensor With Four-Directional Air-Gap Wire Grid and 2.5-µm Pixels, IEEE Transactions on Electron Devices, vol. 65, No. 6, Jun. 2018, pp. 2544-2551.

* cited by examiner

*Primary Examiner* — Hung H Lam
(74) *Attorney, Agent, or Firm* — Cozen O'Connor (57) ABSTRACT

An image sensor configured to resolve intensity and polarization has multiple pixels each having a single microlens adapted to focus light on a central photodiode surrounded by at least a first, a second, a third, and a fourth peripheral photodiodes, where a first polarizer at a first angle is disposed upon the first peripheral photodiode, a third polarizer at a third angle is disposed upon the third peripheral photodiode, a second polarizer at a second angle is disposed upon the second peripheral photodiode, and a fourth polarizer at a fourth angle is disposed upon the fourth peripheral photodiode, the first, second, third, and fourth angles being different. In embodiments, 4 or 8 peripheral photodiodes are provided, and in an embodiment the polarizers are parts of an octagonal polarizer.

11 Claims, 7 Drawing Sheets

| | | |
|---|---|---|
| 1.6 | 5.2 | 1.6 |
| 4.5 | 18.7 | 4.5 |
| 1.6 | 5.4 | 1.6 |

Fig. 11

IMAGE SENSOR WITH SUB-PIXEL PHOTODIODE ARRAY WITH MULTIPLE MINI-WIRE GRID POLARIZERS FOR POLARIZATION IMAGING

BACKGROUND

Typical image sensors record color or wavelength information and intensity information of incoming light, but ignore polarization of the incoming light.

Imaging polarization can provide useful information. Many minerals polarize, or rotate polarization direction of polarized light; some minerals also exhibit birefringence. It can be desirable to image these polarization shifts and patterns while studying such minerals; currently pertrographic polarizing microscopes are used to study some bearing such minerals. Polarized light also has many other applications, including outdoor imaging where imaging through polarization may provide higher image contrast than images obtained without such filters. In particular, light scattering at low angles from surfaces is often polarized so much glare, including glare encountered by drivers and optical vehicular navigation systems, is polarized; polarization-sensitive imaging may therefore allow glare reduction.

Figure 1:
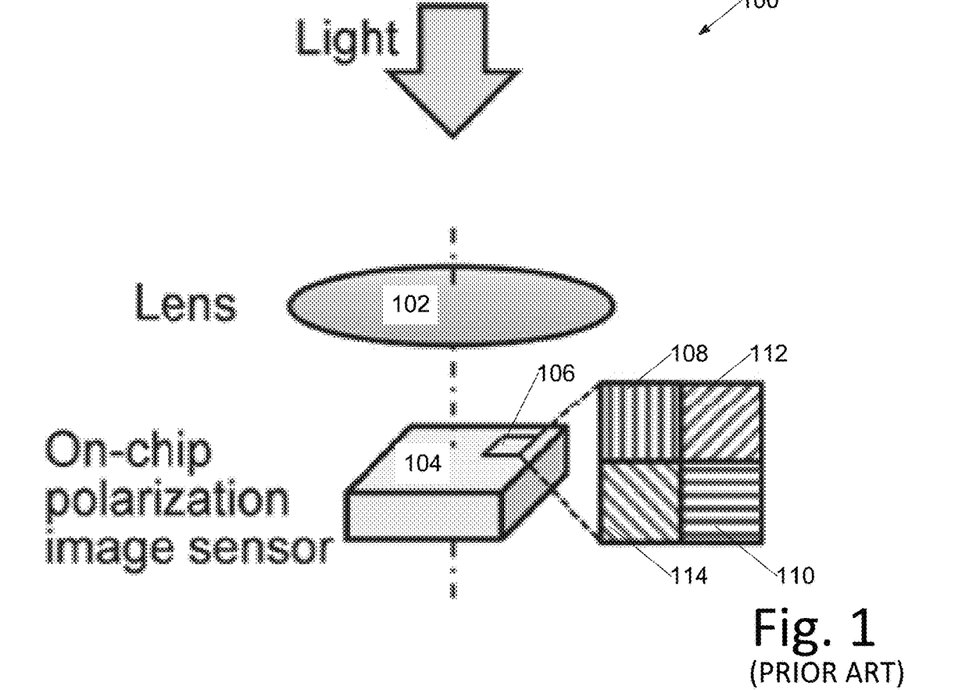
FIG. 1 is a schematic illustration of camera embodying a PRIOR-ART polarization-sensitive image sensor having effectively conductive-line polarizers disposed over photodiodes.

In a prior device, disclosed In 3.2MP Back-Illuminated Polarization Image Sensor with Four-Directional Air-Gap Wire Grid and 2.5-um Pixels, by Yasushi Manuyama et al, IEEE trans Electron Devices Vol 65 no 5 Jun. 2018, 2544 et seq., a camera 100 (FIG. 1) focuses light through a lens 102 onto a polarization-sensitive image sensor 104, image sensor 104 having multiple cells 106 of photodiodes. Each cell of photodiodes 106 has a vertical or zero-degree conductive-metal polarizer 108 over a photodiode, a horizontal or 90-degree conductive-metal polarizer 110 over a photodiode, a 45-degree conductive-metal polarizer 112 over a photodiode, and a 135-degree conductive-metal polarizer 114 over a photodiode.

Figure 2:
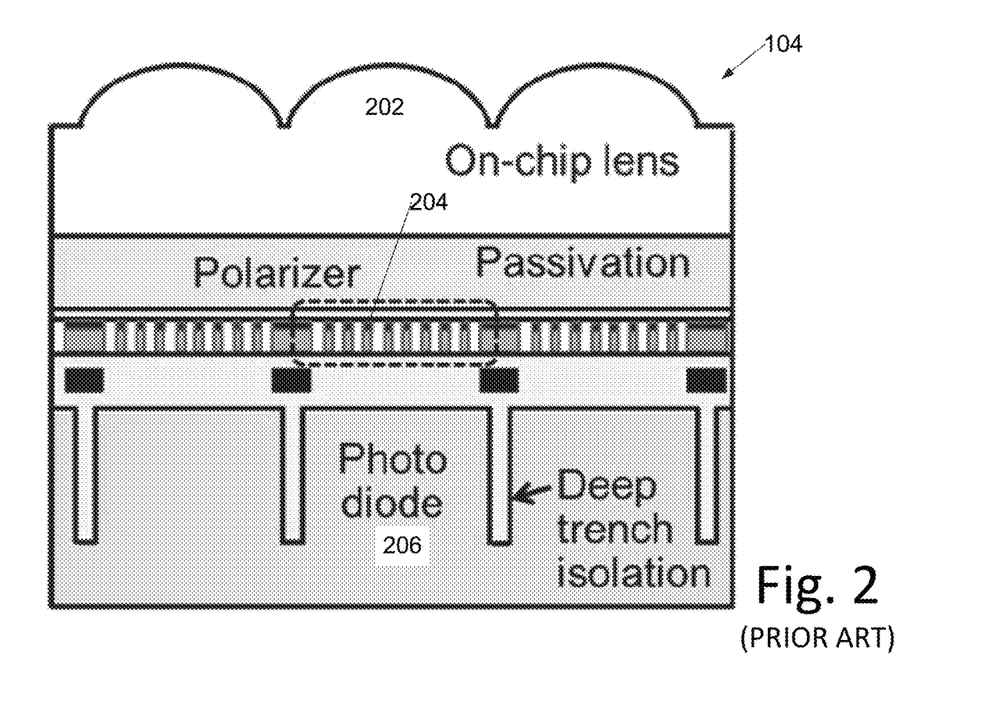
FIG. 2 is a cross sectional illustration of the PRIOR-ART polarization-sensitive image sensor of FIG. 1 illustrating separate microlenses for each photodiode.

In the Manuyama image sensor 104, the image sensor is covered with a layer of microlenses 202, one microlens for each photodiode. Light is focused by the microlenses 202 through conductive metal polarizers 204 (corresponding to a polarizer 112, 114, 108, or 110) onto photodiode 206, with one microlens 202 corresponding to each photodiode 206.

Summary

DETAILED DESCRIPTION OF THE EMBODIMENTS

Figure 3:
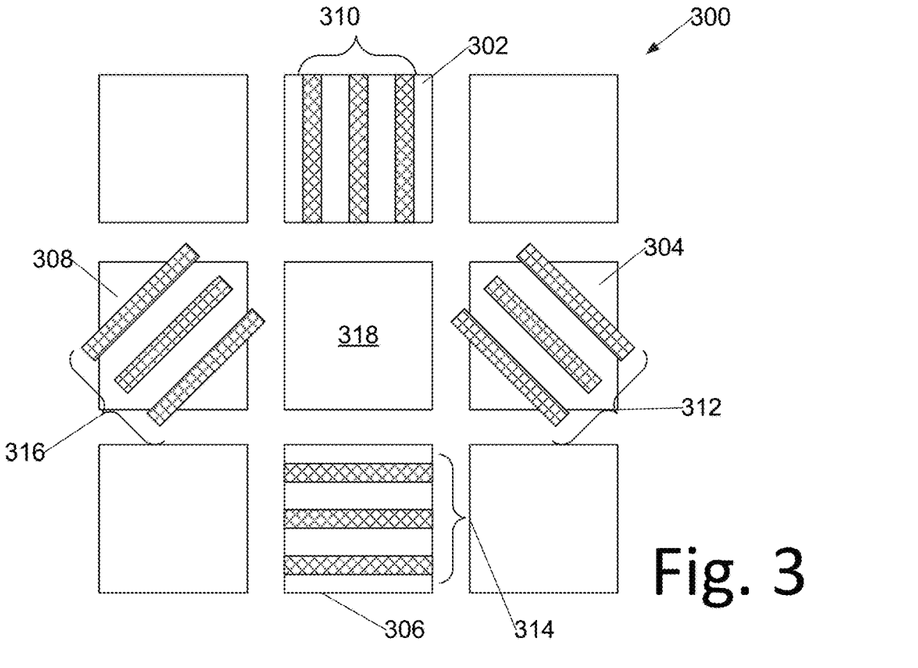
FIG. 3 is a top plan view illustrating an embodiment having four conductive-line polarizers at four angles disposed over photodiodes of each nine-photodiode pixel.

To provide high quantum efficiency while resolving polarization of received light, we provide each pixel, such as 9-photodiode pixels 300 (FIG. 3), or 5-photodiode pixels 500 (FIG. 5), of our backside-illuminated image sensor with at least four photodiodes 302, 304, 306, 308, 502, 504, 506, 508 each having a conductive-line polarizer 310, 312, 314, 316, 510, 512, 514, 516 each at one of four different angles (0, 45, 90, and 135 degrees), and at least one photodiode 318, 518 having no polarizer. In the embodiment of FIG. 3, the conductive line polarizers cover most of the photodiode, and in the embodiment of FIG. 5, the conductive line polarizers cover only part of the photodiodes; in other embodiments the polarizers may cover more, or less, than the photodiode portions illustrated, so long as at least part of each of four photodiodes are covered with polarizers at four or more different angles.

In embodiments suited for a 2.4 micron pixel size, the conductive line polarizers have three conductive metal lines each; in embodiments suited for other pixel sizes a greater or lesser number of metal lines are used in each polarizer.

Figure 5:
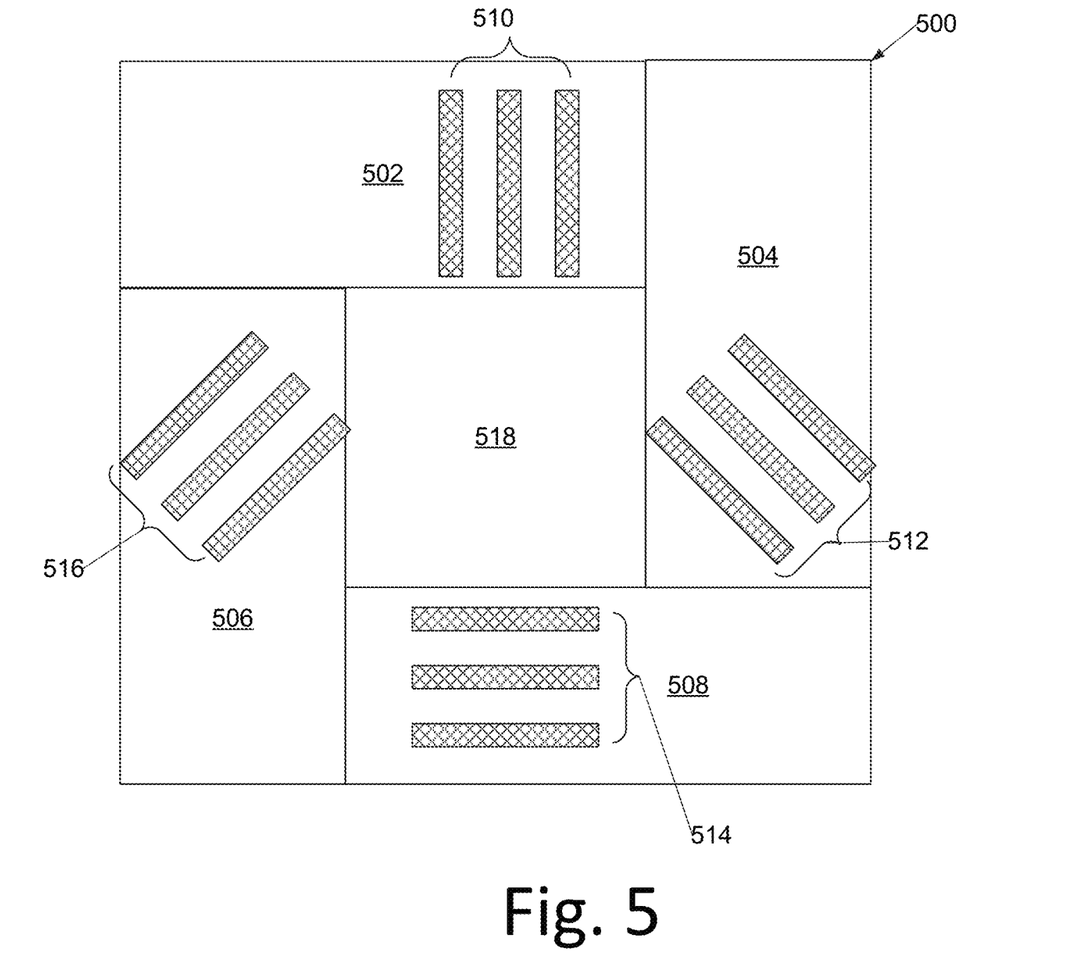
FIG. 5 is a top plan view of an embodiment having four conductive-line polarizers at four angles disposed over four of five photodiodes of a five-photodiode pixel.
Figure 7:
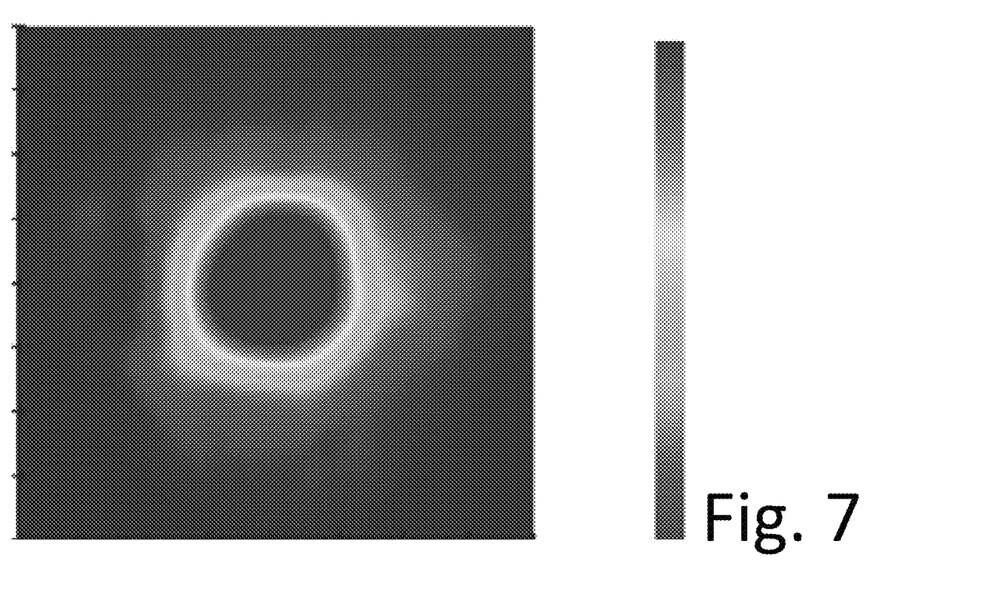
FIG. 7 is a representation from a simulation indicating received light quantity at locations across a pixel according to FIG. 3, showing cancellation at a particular photodiode.

When illuminated with polarized light, the embodiments of FIG. 3 and FIG. 5 produces a significant difference in light intensity across the plane of the photodiodes of the pixel, as illustrated in the simulation plot of FIG. 7.

In an alternative embodiment 400 (FIG. 4), has outer photodiodes 402, 404, 406, 408, 410, 412, 414, 422 covered at least in part by various portions of an octagonal conductive-line polarizer having at least an inner 416 and outer 418 conductive metal ring. In this embodiment, a central photodiode 420 is not covered by the conductive-line polarizer. In this embodiment, outer photodiodes 402 and 412 are partially blocked from receiving light of 45 degree polarization, outer photodiodes 404 and 408 are partially blocked from receiving light of 135 degree polarization, photodiodes 406 and 410 are partially blocked from receiving light of 0 degree polarization, and photodiodes 414 and 422 are partially blocked from receiving light of 90 degree polarization.

Figure 4:
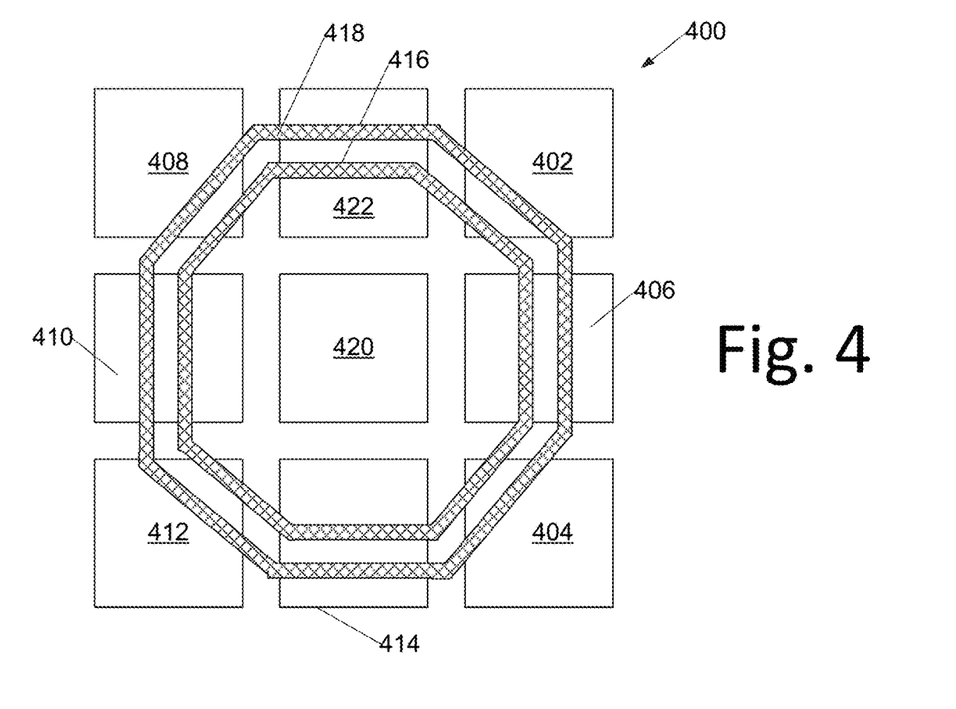
FIG. 4 is a top plan view illustrating an embodiment having an octagonal conductive-line polarizer disposed over photodiodes of each nine-photodiode pixel.
Figure 8:
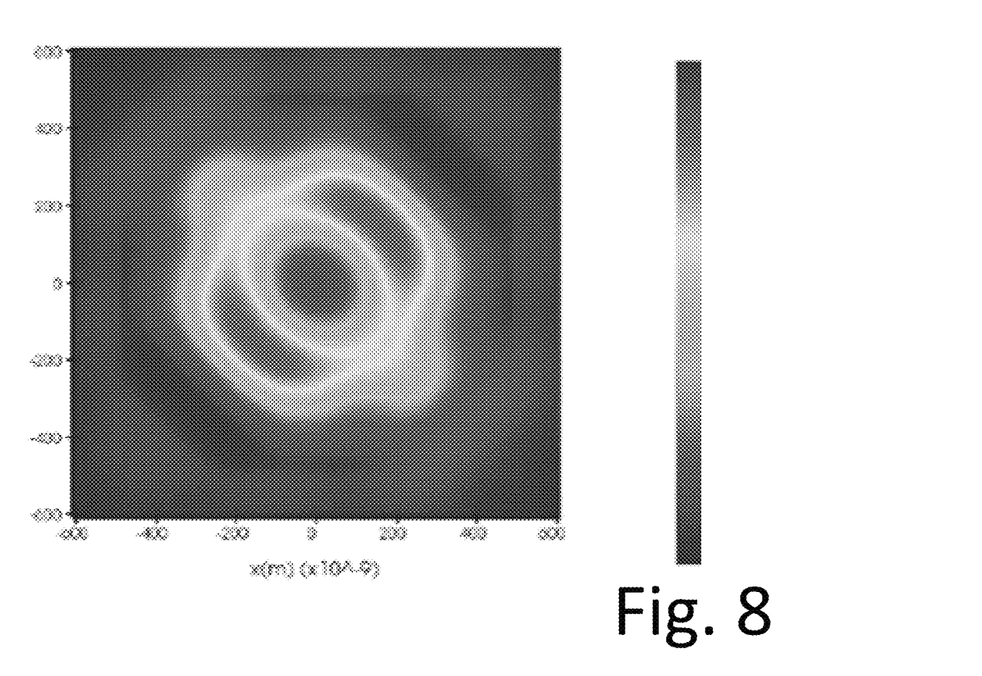
FIG. 8 is a representation from a simulation indicating received light quantity at locations across a pixel according to FIG. 4, showing cancellation at a particular photodiode pair.
Figure 11:
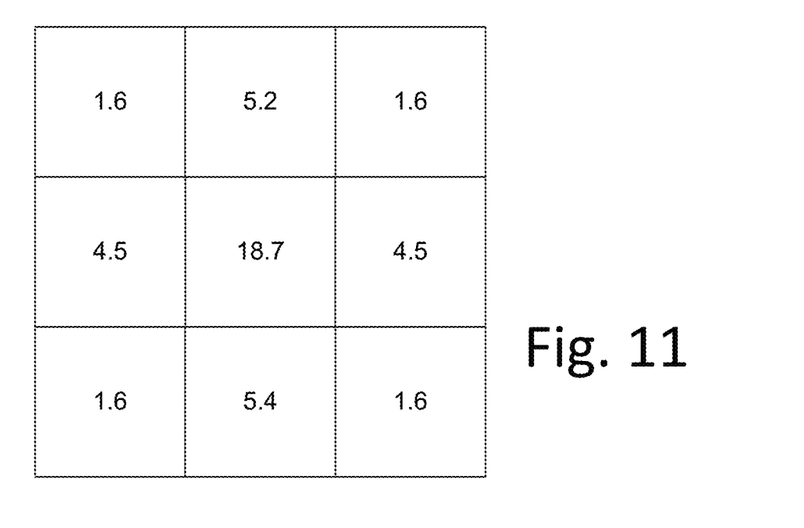
FIG. 11 is an illustration of relative intensity at each photodiode of a pixel according to FIG. 4.

When illuminated with polarized light, the embodiments of FIG. 4 produces a significant difference in light intensity across the plane of the photodiodes of the pixel, as illustrated in the simulation plot of FIG. 8 and illustrated as relative intensity in FIG. 11.

The embodiments of FIGS. 3, 4, and 5 may have an array of wavelength-dependent color filters applied atop the microlenses, as known in the art of Bayer-pattern color image sensors. Such embodiments are capable of not only resolving polarization of incoming light but are also capable of producing full-color images.

In an alternative embodiment 900 (FIG. 9), instead of the refractive converging per-pixel but not per photodiode microlens 602 of other embodiments, a diffractive lens formed of multiple rings 902 of material of a first refractive index disposed in material 904 of a second refractive is used; this diffractive lens is disposed on a spacer 906. The diffractive lens is, however, wavelength dependent so a ratio of light received by central photodiode 908 to light received through polarizers 914 by peripheral photodiodes 910, 912 of the pixel depends on a wavelength of incoming light, making the pixel capable of resolving color to an extent without an applied color filter array as used in typical color image sensors.

Figure 6:
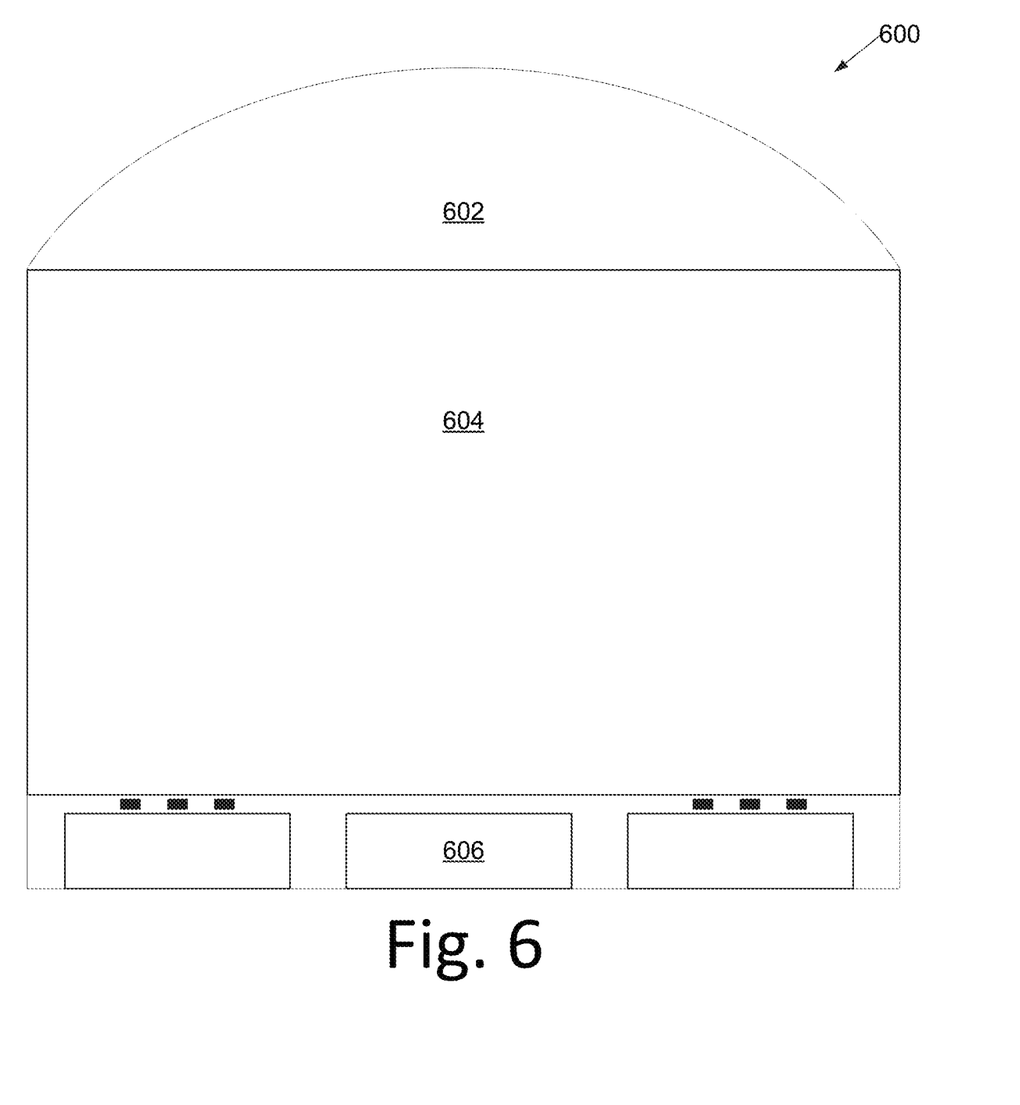
FIG. 6 is a cross sectional diagram of the embodiment of FIG. 3 showing the single microlens associated with the nine-photodiode pixel.
Figure 9:
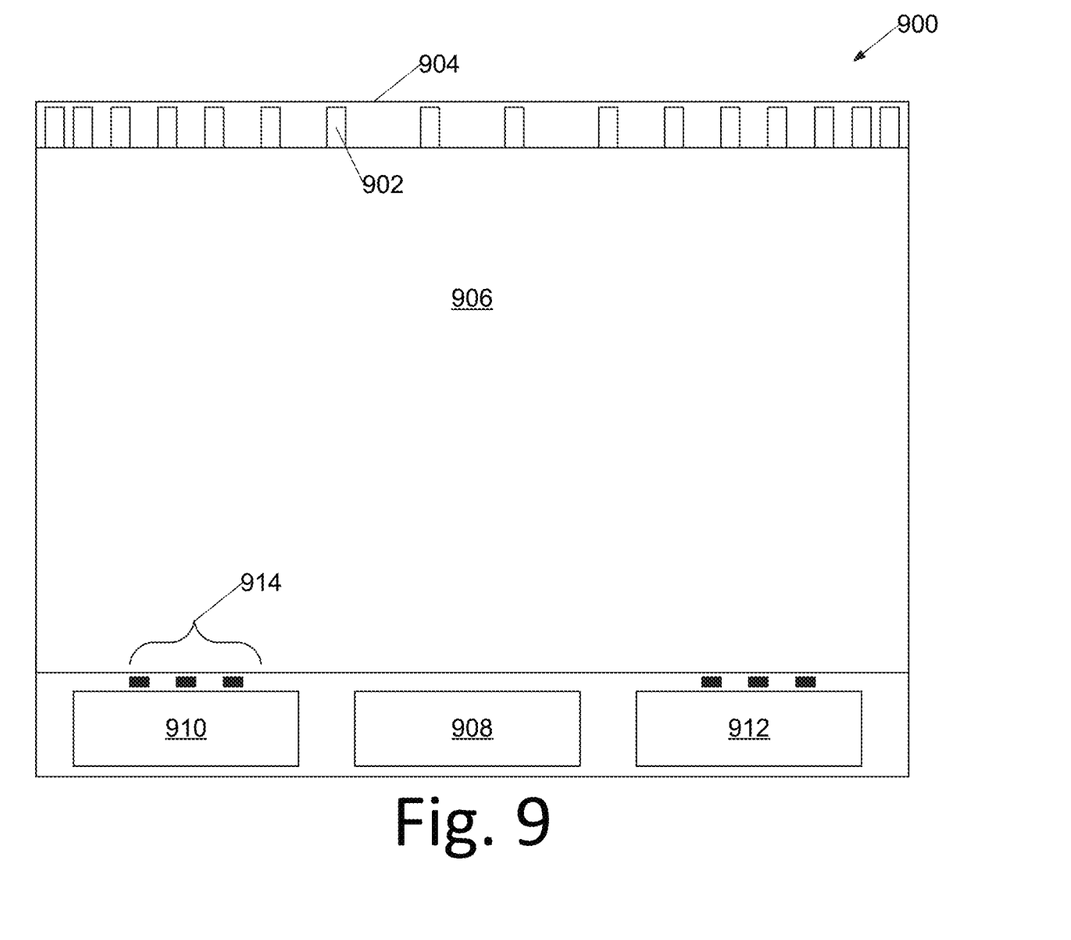
FIG. 9 is a cross sectional diagram of an embodiment having a diffractive micro lens disposed over photodiodes of each nine-photodiode pixel.

The diffractive converging per-pixel microlenses of FIG. 9 and the refractive per-pixel microlenses of FIG. 6 may both be used with the embodiments of FIGS. 3, 4, and 5.

With the embodiments of FIGS. 3, 4, 5, and 9, we have found it is not necessary to use polarizers that null 100% of light of non-favored polarity. So long as significant differences exist at the photodiodes between favored and non-favored polarizations when receiving polarized light, we can use digital image processing to determine polarization parameters including a polarization angle and percentage of polarization for each pixel, and we can process and display images accordingly. We can use the derived polarization angles to display polarization angle alone, percentage of polarization alone, or use the determined polarization parameters to produce images representative of images that would have been received through polarized filters set to any desired angle.

We have found that it is not necessary to provide separate microlenses for each photodiode and polarizer of our polarization-sensitive image sensor pixel, and that using a single microlens for all photodiodes of a pixel has advantages particularly in quantum efficiency for low-light imaging. As illustrated in FIG. 6, each pixel 600 has a single molded microlens 602 with an integral spacer 604 that may incorporate a color filter, the microlens 602 configured to receive and focuses light incoming from a camera lens (not shown in FIG. 6) that focuses light onto the image sensor that has an array of pixels including pixel 600. The microlens 602 focuses the incoming light largely on a central photodiode 606, corresponding to central photodiode 318, 518, 418, of the pixel's photodiode array.

Figure 10:
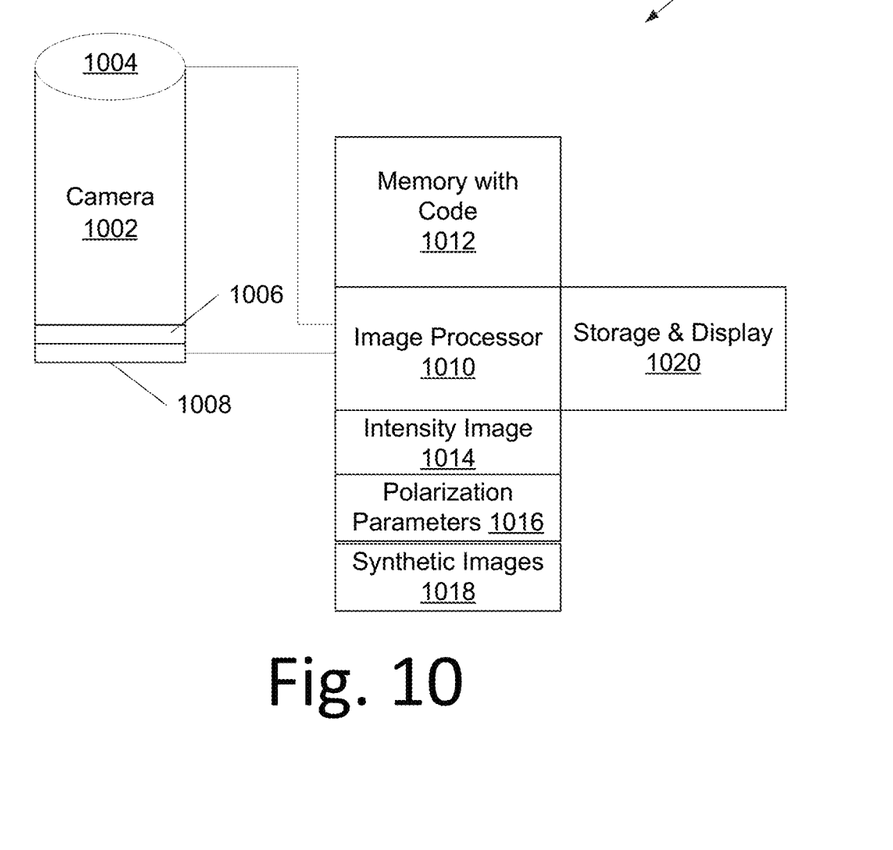
FIG. 10 is a block diagram of a camera system incorporating the polarization-sensitive image sensor and configured to display digitally-processed images incorporating polarization parameters.

The image sensor described herein is used in a camera system 1000 (FIG. 10). Light enters camera 1002 through lens 1004 and passes through the microlenses and polarizers 1006 to enter the image sensor integrated circuit 1008 that includes arrays of the pixels above described. Images, including readings of all 5 (FIG. 5) or 9 (FIGS. 3 and 4) photodiodes of the pixel, are read from image sensor integrated circuit 1008 into an image processor 1010. Image processor 1010 operates according to code in program memory 1012 to store intensity images 1014, then to derive polarization parameters 1016 including polarization angle and polarization percentage. Image processor uses these polarization parameters 1016 and intensity images 1014 to derive synthetic images such as images of polarization or images simulating those that would be obtained through a polarizer set at a particular angle, these synthetic images 1018 are stored or displayed by storage and display unit 1020.

The image sensor herein described is therefore used in a method of determining polarization parameters of each pixel of an image of a scene that includes focusing light from the scene on a polarization-sensitive image sensor, the image sensor including for each pixel a single microlens configured to focus the light primarily on a central photodiode and, disposed around the central photodiode, at least four conductive-metal-line polarizers at at least four polarization angles, each conductive-metal-line polarizer disposed over a separate peripheral photodiode of at least four peripheral photodiodes. The method includes reading intensities from the central and the at least four peripheral photodiodes and determining ratios of these intensities to determine a polarization angle and a polarization percentage for the pixel.

Combinations

An image sensor designated A is configured to resolve polarization includes multiple pixels each including a single microlens adapted to focus light on a central photodiode surrounded by at least a first, a second, a third, and a fourth peripheral photodiodes, where a first polarizer at a first angle overlies the first peripheral photodiode, a third polarizer at a third angle overlies the third peripheral photodiode a second polarizer at a second angle overlies the second peripheral photodiode, and a fourth polarizer at a fourth angle overlies the fourth peripheral photodiode. The first, second, third, and fourth angles are different, and the first, second, third, and fourth polarizers are conductive metal-line polarizers.

An image sensor designated AA includes the image sensor designated A and further includes a fifth, sixth, seventh, and eighth, peripheral photodiode.

An image sensor designated AB includes the image sensor designated A and further has the first, second, third, and fourth polarizers as portions of an octagonal polarizer, and the octagonal polarizer is disposed on the fifth peripheral photodiode at the first angle, on the sixth peripheral photodiode at the second angle, on the seventh peripheral photodiode at the third angle, and on the eighth peripheral photodiode at the fourth angle.

An image sensor designated ABA includes the image sensor designated A where the octagonal polarizer comprises at least two conductive metal lines.

An image sensor designated AC includes the image sensor designated A, AA, AB, or ABA and further includes an image processor configured to determine polarization parameters from readings of the first, second, third, and fourth peripheral photodiodes and from readings of the central photodiode.

An image sensor designated AD includes the image sensor designated AC wherein the polarization parameters include a polarization angle and a polarization percentage.

An image sensor designated AE includes the image sensor designated A, AA, AB, ABA, AC, or AD where the first, second, third, and fourth polarizers are three-line conductive metal line polarizers.

An image sensor designated AF includes the image sensor designated A, AA, AB, ABA, AC, AD, or AE further includes an image processor configured to determine polarization parameters from readings of the first, second, third, and fourth peripheral photodiodes and from readings of the central photodiode.

An image sensor designated AG including the image sensor designated AF wherein the polarization parameters include a polarization angle and a polarization percentage.

A method designated B of determining polarization parameters of each pixel of an image of a scene includes focusing light from the scene on a polarization-sensitive image sensor, the image sensor having multiple pixels, each pixel having a single microlens configured to focus the light from the scene primarily on a central photodiode with at least some light reaching at least four conductive-metal-line polarizers at at least four polarization angles, each conductive-metal-line polarizer being disposed over a separate peripheral photodiode of at least four peripheral photodiodes disposed around the central photodiode. The method continues with reading intensities from the central photodiode and the at least four peripheral photodiodes; and determining ratios of these intensities to determine a polarization angle and a polarization percentage for the pixel.

A method designated BA including the method designated B where there are eight peripheral photodiodes per pixel.

A method designated BAA including the method designated B where the at least four conductive-metal-line polarizers are portions of an octagonal polarizer disposed over the eight peripheral photodiodes.

A method designated BB including the method designated B where there are five photodiodes per pixel.

Changes may be made in the above methods and systems without departing from the scope hereof. It should thus be noted that the matter contained in the above description or shown in the accompanying drawings should be interpreted as illustrative and not in a limiting sense. The following claims are intended to cover all generic and specific features described herein, as well as all statements of the scope of the present method and system, which, as a matter of language, might be said to fall therebetween. It is also anticipated that steps of methods may be performed in an order different from that illustrated and still be within the meaning of the claims that follow

What is claimed is:

1. An image sensor configured to resolve polarization comprising:
    a plurality of pixels each comprising a single microlens adapted to focus light on a central photodiode surrounded by at least a first, a second, a third, and a fourth peripheral photodiodes, where a first polarizer at a first angle is disposed upon the first peripheral photodiode, a third polarizer at a third angle is disposed upon the third peripheral photodiode, a second polarizer at a second angle is disposed upon the second peripheral photodiode, and a fourth polarizer at a fourth angle is disposed upon the fourth peripheral photodiode, the first, second, third, and fourth angles being different, and where the first, second, third, and fourth polarizers are conductive metal-line polarizers; and
    a fifth, sixth, seventh, and eighth, peripheral photodiode;
    wherein the first, second, third, and fourth polarizers are portions of an octagonal polarizer, and where the octagonal polarizer is disposed on the fifth peripheral photodiode at the first angle, on the sixth peripheral photodiode at the second angle, on the seventh peripheral photodiode at the third angle, and on the eighth peripheral photodiode at the fourth angle.

2. An image sensor of claim 1 where the first, second, third, and fourth polarizers are three-line conductive metal line polarizers.

3. An image sensor of claim 2 further comprising an image processor configured to determine polarization parameters from readings of the first, second, third, and fourth peripheral photodiodes and from readings of the central photodiode.

4. The image sensor of claim 3 wherein the polarization parameters include a polarization angle and a polarization percentage.

5. An image sensor configured to resolve polarization comprising:
    a plurality of pixels each comprising a single microlens adapted to focus light on a central photodiode surrounded by at least a first, a second, a third, and a fourth peripheral photodiodes, where a first polarizer at a first angle is disposed upon the first peripheral photodiode, a third polarizer at a third angle is disposed upon the third peripheral photodiode, a second polarizer at a second angle is disposed upon the second peripheral photodiode, and a fourth polarizer at a fourth angle is disposed upon the fourth peripheral photodiode, the first, second, third, and fourth angles being different, and where the first, second, third, and fourth polarizers are conductive metal-line polarizers, and
    where the octagonal polarizer comprises at least two conductive metal lines.

6. An image sensor of claim 5 further comprising an image processor configured to determine polarization parameters from readings of the first, second, third, and fourth peripheral photodiodes and from readings of the central photodiode.

7. The image sensor of claim 6, wherein the polarization parameters include a polarization angle and a polarization percentage.

8. A method of determining polarization parameters of each pixel of an image of a scene comprises:
    focusing light from the scene on a polarization-sensitive image sensor, the image sensor comprising a plurality of pixels, each pixel comprising a single microlens configured to focus the light from the scene primarily on a central photodiode with at least some light reaching at least four conductive-metal-line polarizers at at least four polarization angles, each conductive-metal-line polarizer being disposed over a separate peripheral photodiode of at least four peripheral photodiodes disposed around the central photodiode;
    reading intensities from the central photodiode and the at least four peripheral photodiodes; and
    determining ratios of these intensities to determine a polarization angle and a polarization percentage for the pixel.

9. The method of claim 8 where there are eight peripheral photodiodes per pixel.

10. The method of claim 9 where the at least four conductive-metal-line polarizers are portions of an octagonal polarizer disposed over the eight peripheral photodiodes.

11. The method of claim 8 where there are five photodiodes per pixel.

* * * * *